United States Patent
Tiapkin et al.

(10) Patent No.: US 12,085,422 B2
(45) Date of Patent: Sep. 10, 2024

(54) MULTI-SENSOR POSITION MEASUREMENT SYSTEM

(71) Applicant: HIWIN MIKROSYSTEM CORP., Taichung (TW)

(72) Inventors: Mikhail Tiapkin, Taichung (TW); Oleg Tolstykh, Taichung (TW); Gennady Tyapkin, Taichung (TW); Aleksandr Balkovoi, Taichung (TW)

(73) Assignee: HIWIN MIKROSYSTEM CORP., Taichung (TW)

( * ) Notice: Subject to any disclaimer, the term of this patent is extended or adjusted under 35 U.S.C. 154(b) by 205 days.

(21) Appl. No.: 17/855,489

(22) Filed: Jun. 30, 2022

(65) Prior Publication Data

US 2022/0333954 A1    Oct. 20, 2022

Related U.S. Application Data

(63) Continuation-in-part of application No. 17/153,628, filed on Jan. 20, 2021, now Pat. No. 11,774,521.

(51) Int. Cl.
*G01D 5/16* (2006.01)
*G01D 5/14* (2006.01)

(52) U.S. Cl.
CPC .............. *G01D 5/16* (2013.01); *G01D 5/147* (2013.01)

(58) Field of Classification Search
CPC .................................. G01D 5/16; G01D 5/147
See application file for complete search history.

(56) References Cited

U.S. PATENT DOCUMENTS 5,793,201 A * 8/1998 Nelle ...................... G01B 7/30
324/207.2
7,932,684 B2    4/2011 O'Day et al.
(Continued)

FOREIGN PATENT DOCUMENTS

AT          404191       9/1998
JP    2008-536145 A    9/2008
(Continued)

OTHER PUBLICATIONS

Shengchao Zhen et al., "Force Ripple Modeling and Minimizing of an Ironless Permanent-Magnet Linear Synchronous Motor", Int. J. Precis. Eng. Manuf. 20, 927-935 (2019). https://doi.org/10.1007/s12541-019-00065-5.

(Continued)

*Primary Examiner* — Walter L Lindsay, Jr.
*Assistant Examiner* — Milton Gonzalez
(74) *Attorney, Agent, or Firm* — Guice Patents PLLC

(57) ABSTRACT

The invention discloses a multi-sensor position measurement system mainly comprising a base, a carrier and a modular component, the carrier is provided with a first signal array and a second signal array. The modular component is disposed on the base, and comprises two Hall sensors for sensing magnetic field changes of the first signal array, two magnetoresistive sensors for sensing magnetic field changes of the second signal array, and a first state sensor having a marking unit disposed on the carrier and a sensitive element disposed on the base for sensing signals generated by the marking unit for subsequent reference signal generation, connection of measurement results between other sensors, and identification of homing direction.

12 Claims, 13 Drawing Sheets

(56) References Cited

U.S. PATENT DOCUMENTS

| | | | |
|---|---|---|---|
| 8,497,643 B2* | 7/2013 | Takagi | H02K 41/03 318/135 |
| 10,476,413 B2 | 11/2019 | Weber et al. | |
| 2010/0241383 A1 | 9/2010 | Teraguchi | |
| 2019/0047794 A1 | 2/2019 | Ozimek et al. | |
| 2020/0166389 A1 | 5/2020 | Huang et al. | |

FOREIGN PATENT DOCUMENTS

| | | |
|---|---|---|
| JP | 2015045594 | 3/2015 |
| TW | 201944033 A | 11/2019 |
| WO | 2022092113 | 5/2022 |

OTHER PUBLICATIONS

G. Rigatos, P. Siano, F. Marignetti and I. Gros, "A nonlinear optimal control approach for PM Linear Synchronous Motors," 2018 IEEE 16th International Conference on Industrial Informatics (INDIN), 2018, pp. 453-458, doi: 10.1109/INDIN.2018.8472019.

* cited by examiner

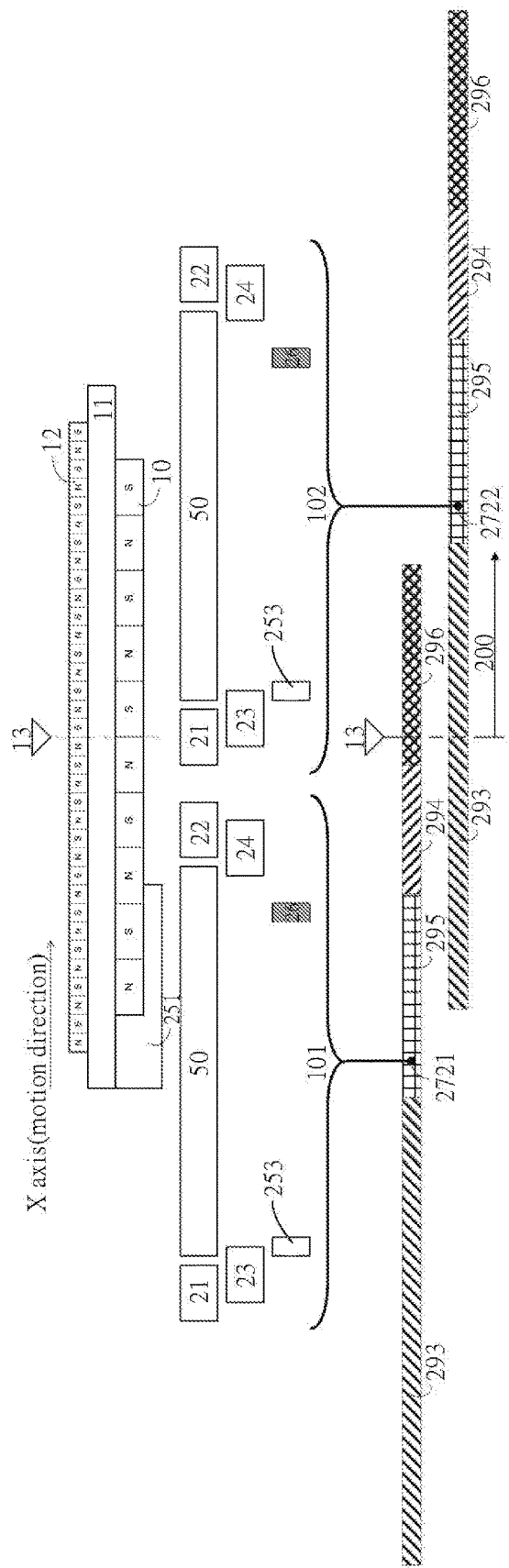
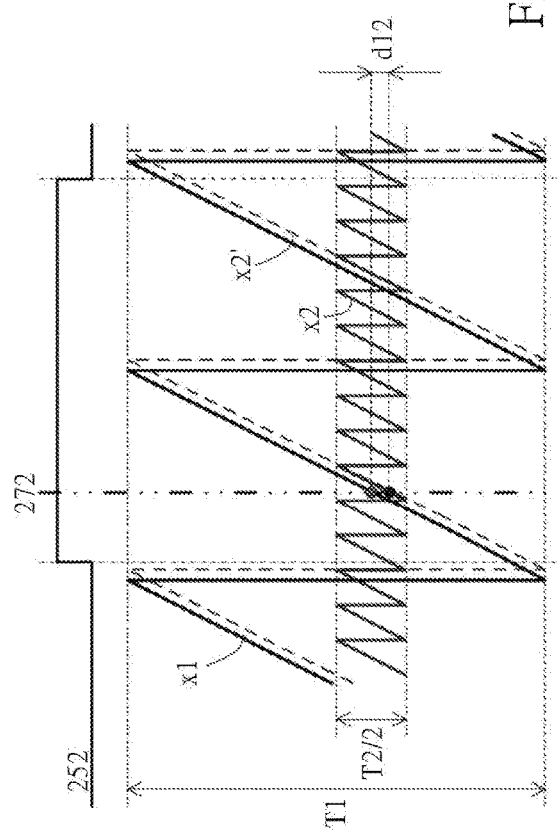
Fig. 12
Fig. 13

MULTI-SENSOR POSITION MEASUREMENT SYSTEM

This patent application is a continuation-in-part of U.S. patent application Ser. No. 17/153,628, filed on Jan. 20, 2021, the contents of which are incorporated herein by reference in their entirety.

BACKGROUND OF THE INVENTION

Field of Invention

The invention is related to position measurement technology, and more particularly to a multi-sensor position measurement system.

Related Art

Conventional position measurement systems usually use Hall sensor for detection, but its disadvantages are low accuracy, about ±0.25 mm, and low resolution, which limit the application of Hall sensor in high-precision industrial fields.

Moreover, in order to ensure the accuracy of measurement position, initialization is usually performed, but if there are too many sensors and carriers, the initialization process will be quite complicated.

Therefore, how to simplify the initialization process and improve the accuracy under the premise of reducing the cost of the measurement system will need to be considered by the relevant manufacturers in the industry.

SUMMARY OF THE INVENTION

Therefore, a main object of the invention is to provide a multi-sensor position measurement system capable of accurately measuring a position of a carrier.

In order to achieve the above object, the multi-sensor position measurement system of the invention mainly has a modular component comprising two primary sensors and two secondary high-precision sensors, wherein use of segmented switching detection between the primary sensors and the secondary high-precision sensors is capable of achieving an efficacy of high-precision detection.

Specifically, the system further comprises a base, a carrier, a first signal array and a second signal array, wherein the carrier is capable of moving relative to the base. The signal arrays are disposed on the carrier and spaced apart from each other, and respectively have a plurality of signal source elements arranged in sequence, and a signal period of the second signal array is less than a signal period of the first signal array to improve measurement accuracy.

Wherein the modular component further comprises a processing unit for receiving signals detected by the sensors, and calculating a position of the carrier, and a first state sensor for generating reference signals, connecting measurement results between other sensors, and identifying homing direction.

In one embodiment, a first sensor and a second sensor are primary sensors, such as Hall sensors for position feedback, a third sensor and a fourth sensor are used as secondary high-precision sensors, such as anisotropic magnetoresistive sensors for modifying a position measured by the primary sensors and determining a motor current commutation phase.

In one embodiment, when the first state sensor is activated, the first state sensor is located at an end of a measuring range of the first sensor, and an amplitude signal of the second sensor is higher than a predetermined threshold value.

In one embodiment, the processing unit calculates measurement results of the sensors by using a weighting function to obtain a reference signal.

In one embodiment, the processing unit compares an amplitude signal of each of the Hall sensors with a predetermined threshold value according to the reference signal, and analyzes a state of the first state sensor for using as a basis for estimating a moving direction of the carrier.

In one embodiment, a measuring module further comprises a second state sensor located at an end of a measuring range of the measuring module and having a marking unit disposed on the carrier and a sensitive element disposed on the base for sensing signals generated by the marking unit.

Wherein when the second state sensor is activated, the second state sensor is located at an end of a measuring range of the second sensor, and an amplitude signal of the first sensor is lower than a predetermined threshold value.

In one embodiment, a mechanical shift related to a signal period is defined by phase changes between the first signal array and the second signal array on the carrier for the processing unit to identify the carrier.

In one embodiment, a measuring range of the measuring module is divided into a positive homing area and a negative homing area by an initial position, and an automatic homing direction of the carrier is estimated through measurement results of the sensors.

In one embodiment, the modular component further comprises a stator, and the two Hall sensors and the two magnetoresistive sensors are respectively located on two sides of the stator, when the first signal array is located above the stator, the processing unit starts homing operation.

In summary, the invention solves the problems of low precision, difficult identification of a carrier and complicated initialization calculation of the conventional measurement systems by using the modular component.

BRIEF DESCRIPTION OF THE DRAWINGS

FIG. 12 is a schematic diagram of homing identification between the two modular components according to a fifth embodiment of the invention.

FIG. 13 is a schematic diagram of identification principle for a carrier according to the fifth embodiment of the invention.

DETAILED DESCRIPTION OF THE INVENTION

Figure 1:
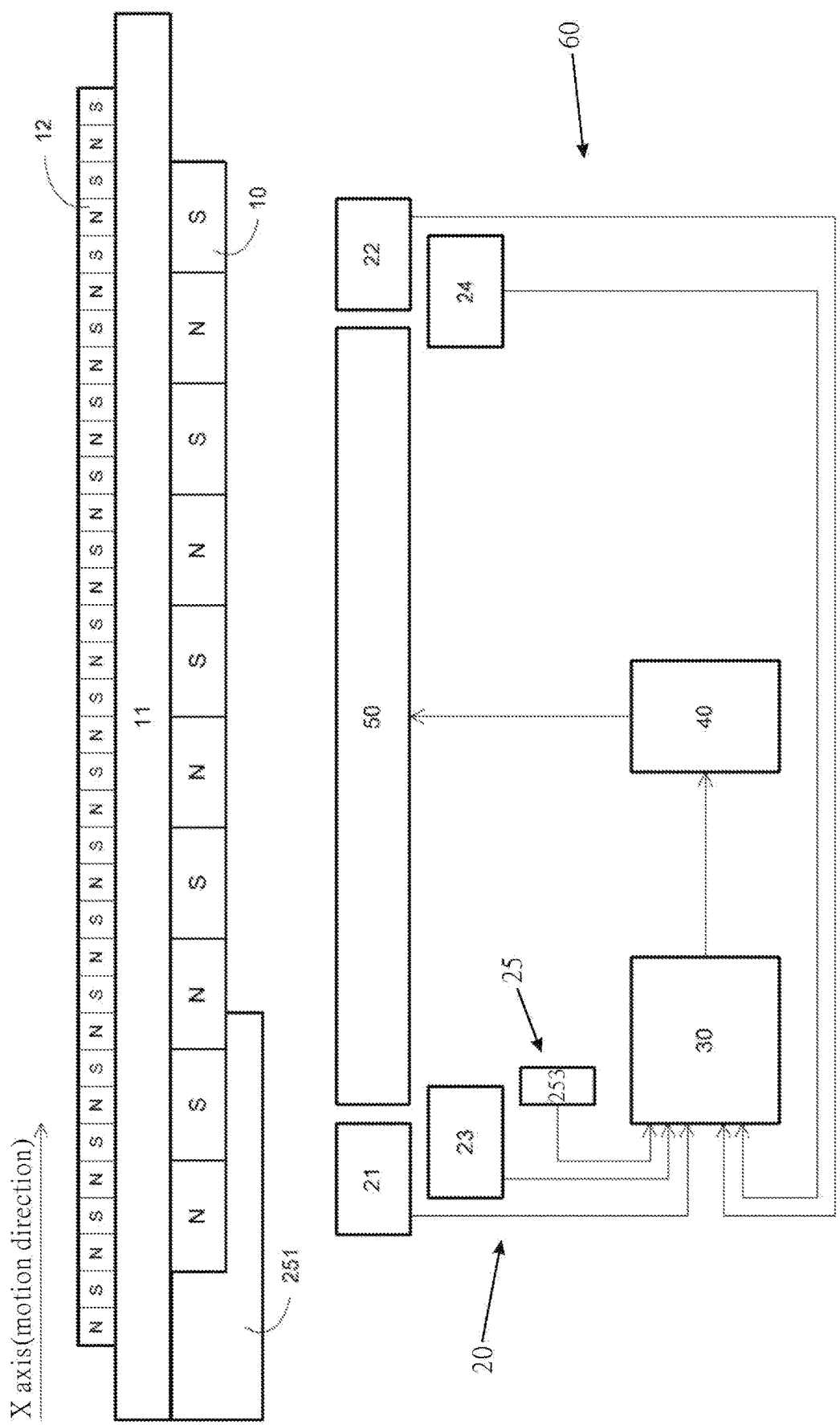
FIG. 1 is a schematic diagram of a first embodiment of the invention.
Figure 1A:
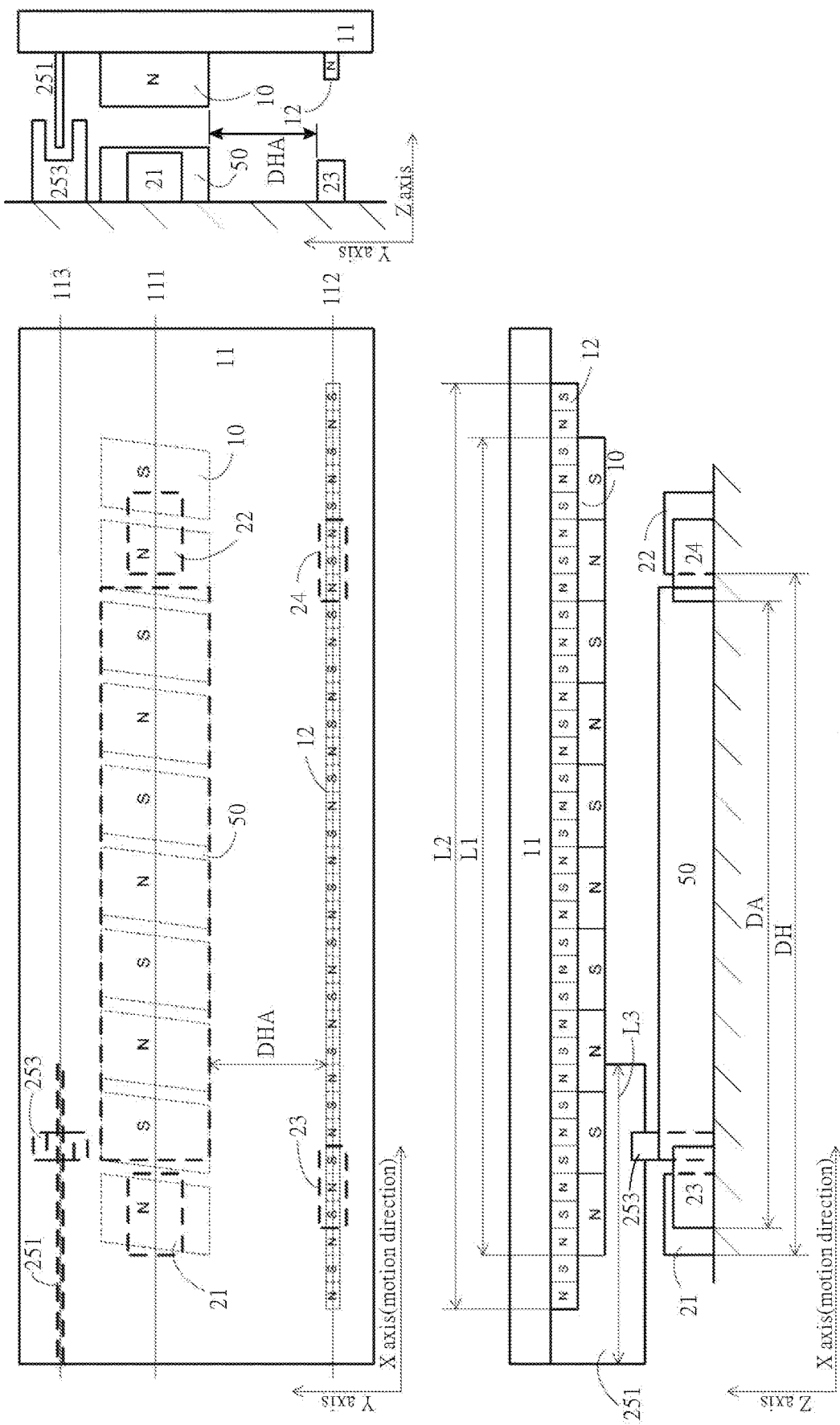
FIG. 1A is a plan view, a side view and a front view of specific positional relationship of each component according to the first embodiment of the invention.

First of all, it should be noted that the ordering terms such as first and second in this specification are only used to facilitate the description of distinction between components, and have no technical meaning in themselves, and will be omitted when no distinction is necessary.

As shown in FIG. 1 to FIG. 6, a multi-sensor position measurement system provided by a first embodiment of the invention mainly comprises a base, a moving part and a modular component 60.

The base has a length, and is used as a basis for construction of other components. Taking a linear motor as an example, the base is a stator seat of the linear motor.

The moving part has a first signal array 10, a carrier 11 and a second signal array 12, wherein the carrier 11 has a length and can be movably located on one side of the base, and the signal arrays 10, 12 are disposed on the carrier 11 by spacing apart from each other. In this embodiment, a linear motor is used as an example, the first signal array 10 is a magnet array on a rotor, in addition to interacting with a magnetic field caused by a coil in a stator to make the moving part perform linear displacement, the magnet is used as a signal source. The second signal array 12 can be a conventional technique such as a magnetic scale or an optical scale which is regularly arranged by using magnetic, electrical or optical non-contact signal source elements; in this embodiment, the second signal array 12 is a magnetic scale composed of a plurality of magnetic elements 101 such as magnets. Thereby the signal arrays 10, 12 respectively have magnetic periods T1, T2 and extend along a long axis direction of the carrier 11 to have predetermined lengths L1, L2 respectively. And make T2<T1 to improve a detection accuracy, and make L1 at least a multiple of two T2.

In addition, there is a spacing DHA between the signal arrays 10, 12 to reduce magnetic fields of the signal arrays 10, 12 affecting each other, for example, the spacing DHA can be 60 mm, but is not limited thereto.

A preset predetermined width of the modular component 60 is a step length DM, and the modular component 60 has a measuring module 20, a processing unit 30, a driving unit 40 and a stator 50, wherein the stator 50 is disposed on the base and interacts with a magnetic field of the first signal array 10 to drive the carrier 11 to move relative to the base. The processing unit 30 receives information sensed by the measuring module 20, obtains position information related to the carrier 11 through operation, and feeds the position information back to the driving unit 40, and then the driving unit 40 controls power supply to the stator 50, such as current commutation.

Figure 2:
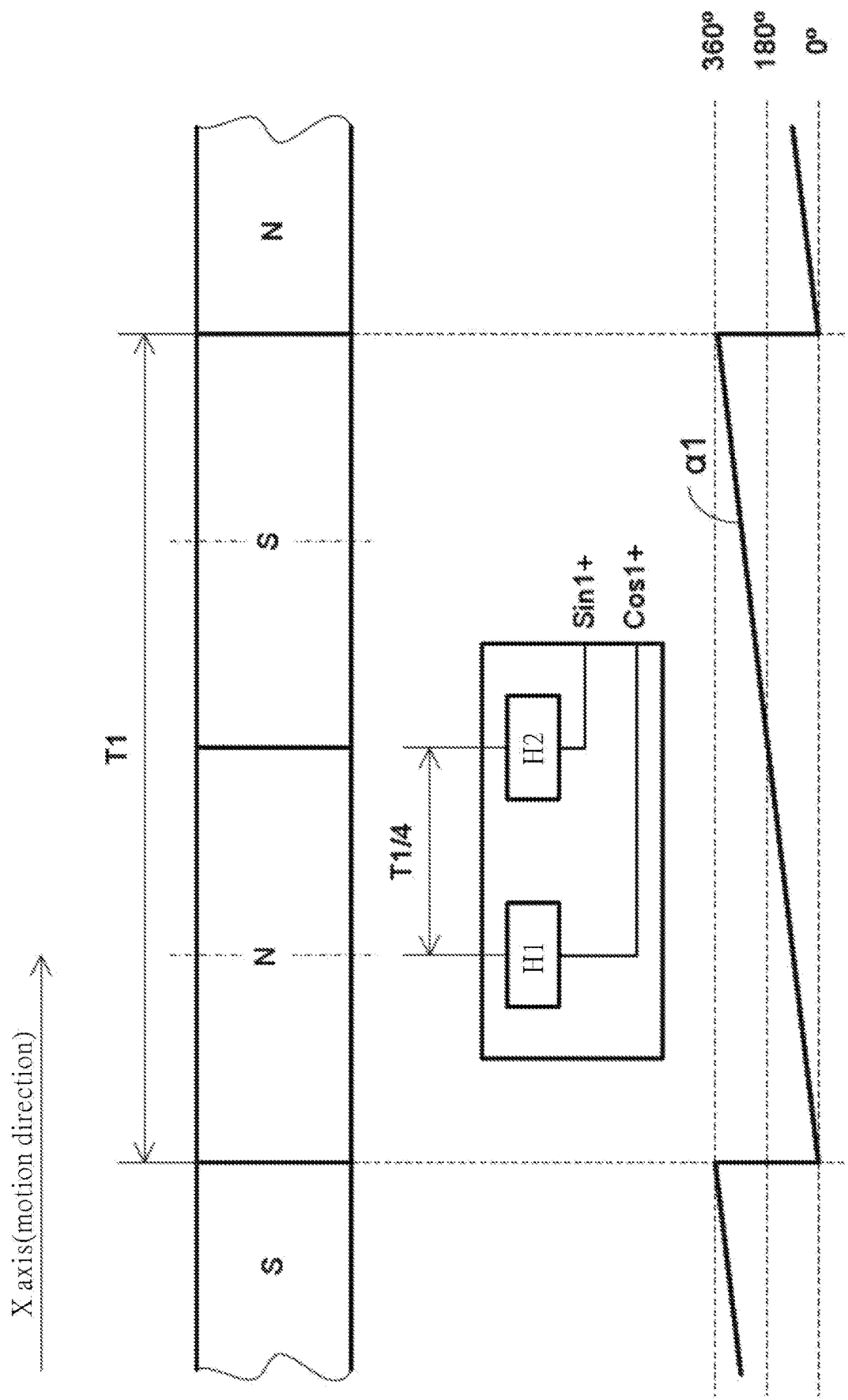
FIG. 2 is a schematic diagram of internal components of a Hall sensor.
Figure 3:
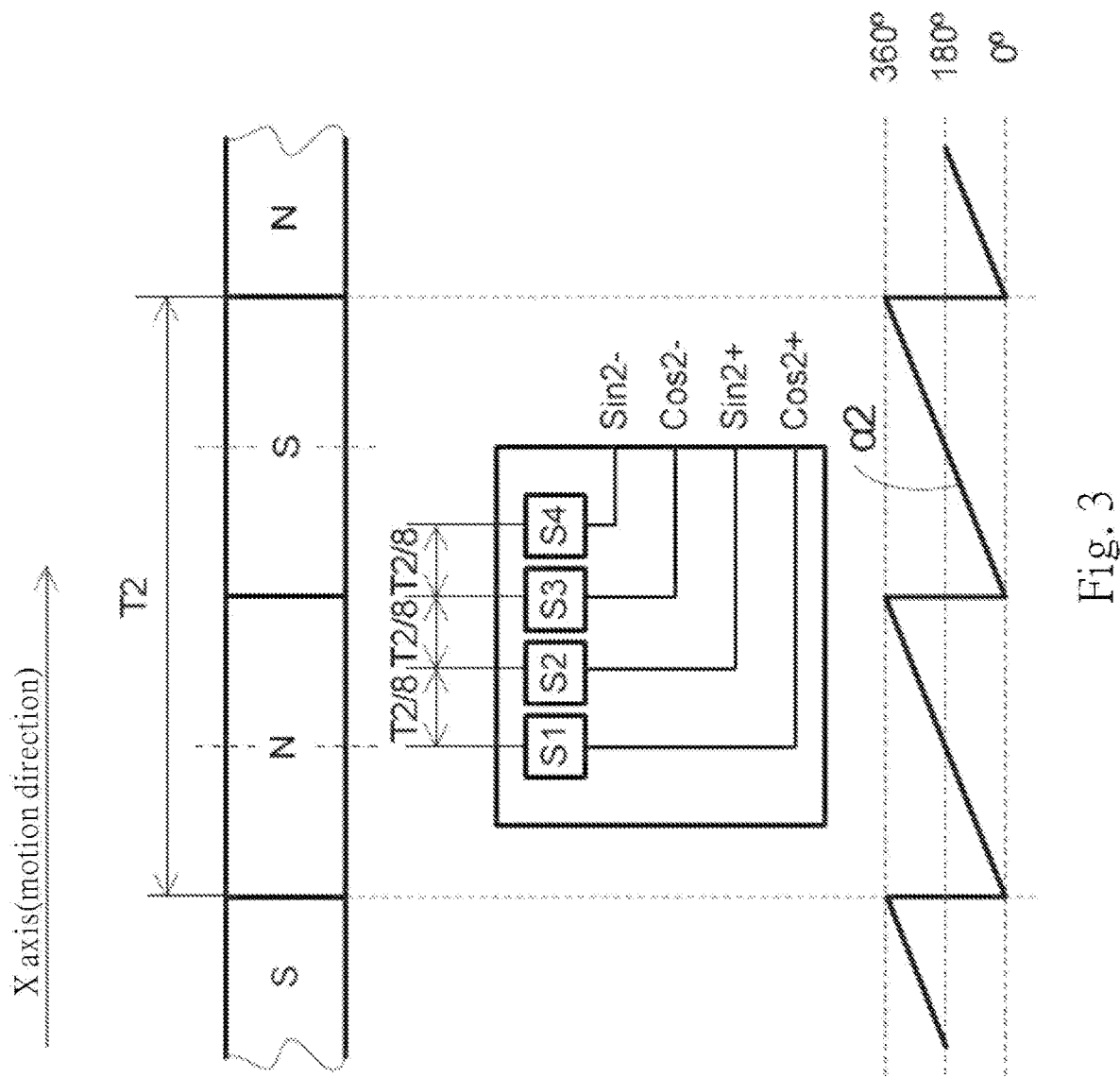
FIG. 3 is a schematic diagram of internal components of a magnetoresistive sensor.

The measuring module 20 has a first sensor 21, a second sensor 22, a third sensor 23, a fourth sensor 24 and a first state sensor 25, wherein the first and second sensors are respectively Hall sensors 21, 22 serving as primary sensors, and are located at two ends of the base in a long axis direction, and the stator 50 is located between the Hall sensors 21, 22. The Hall sensors 21, 22 are capable of sensing magnetic field changes of the first signal array 10 for using as a basis for position feedback of the carrier 11, and a spacing DH between the Hall sensors 21, 22 is an integer multiple of the magnetic period T1.

Wherein each of the Hall sensors 21, 22 has at least two sensitive elements H1, H2 respectively, which are respectively disposed along an X-axis with T1/4, as shown in FIG. 2. When the carrier 11 moves along the X-axis, an output signal of each of the sensitive elements H1, H2 is direct proportional to cosine and sine differential signals Cos 1+, Sin 1+ respectively, that is, $U_{cos1} = U_{amp1} \cos(\alpha 1)$, $U_{sin1} = U_{amp1} \sin(\alpha 1)$, wherein $\alpha 1$ is a signal phase, $U_{ampi1}$ is an amplitude signal, and a sub-period position x1 is calculated by the processing unit 30 according to formula 1:

$$x1 = (T1/360°)\alpha 1 = (T1/360°) \cdot \text{atan } 2(U_{Sin1+}, U_{Cos1+}) \quad \text{(formula 1)},$$

wherein atan 2(y,x) is a four-quadrant arctangent function.

Since positions of the Hall sensors 21, 22 relative to the stator 50 are known, directly switching to another set of high-precision measurement sensors after an electric current is commutated can be done without requiring the driving unit 40 to take any action to find a current commutation phase, which is quite convenient.

The third and fourth sensors 23, 24 are magnetoresistive sensors serving as secondary high-precision sensors, such as anisotropic magnetoresistive sensors, which are used to detect motor current commutation during system initialization, and to sense magnetic field changes of the second signal array 12. The magnetoresistive sensors 23, are respectively located at the two ends of the base in the long axis direction, and the stator 50 is interposed between the magnetoresistive sensors 23, 24.

Wherein each of the magnetoresistive sensors 23, 24 comprises at least four sensitive elements (S1, S2, S3 and S4) respectively, which are respectively disposed along the X-axis with T2/8. When the carrier 11 moves along the X-axis, a signal output by each of the sensitive elements S1, S2, S3, S4 is direct proportional to a half period of cosine and sine differential signals Cos 2+, Sin 2+, Cos 2−, and Sin 2−respectively, that is, anisotropic magnetoresistive effects of the cosine and sine differential signals:

$$U_{Cos2+} = U_{ampl2} \cos(\alpha 2),$$

$$U_{Sin2+} = U_{ampl2} \sin(\alpha 2),$$

$$U_{cos2-} = -U_{ampl2} \cos(\alpha 2),$$

$$U_{Sin2-} = -U_{ampl2} \sin(\alpha 2),$$

wherein $\alpha 2$ is a signal phase, and $U_{ampl2}$ is an amplitude signal.

The processing unit 30 uses an arctangent trigonometric function to estimate a sub-period position x2 in half of the magnetic period T2:

$$x2 = (T2/720°) \cdot \alpha 2 = (T2/720°) \cdot \text{atan } 2(U_{sin2+} - U_{sin2-}), \\ (U_{Cos2+} - U_{Cos2-}) \quad \text{(formula 2)}$$

In addition, the invention simplifies a switching procedure between the signal arrays 10, 12 through the following conditions, that is, a spacing DA between the magnetoresistive sensors 23, 24 is an integer multiple of the magnetic period T1. T1 is an integer multiple of T2, such as T1=30 mm, T2=10 mm. L1 is an integer multiple of T1 and is equal to the step length DM. L2 is at least two T2, as shown in the following relation:

$$L2 = L1 + 2 \cdot T2 \quad \text{(formula 3)}$$

Figure 4:
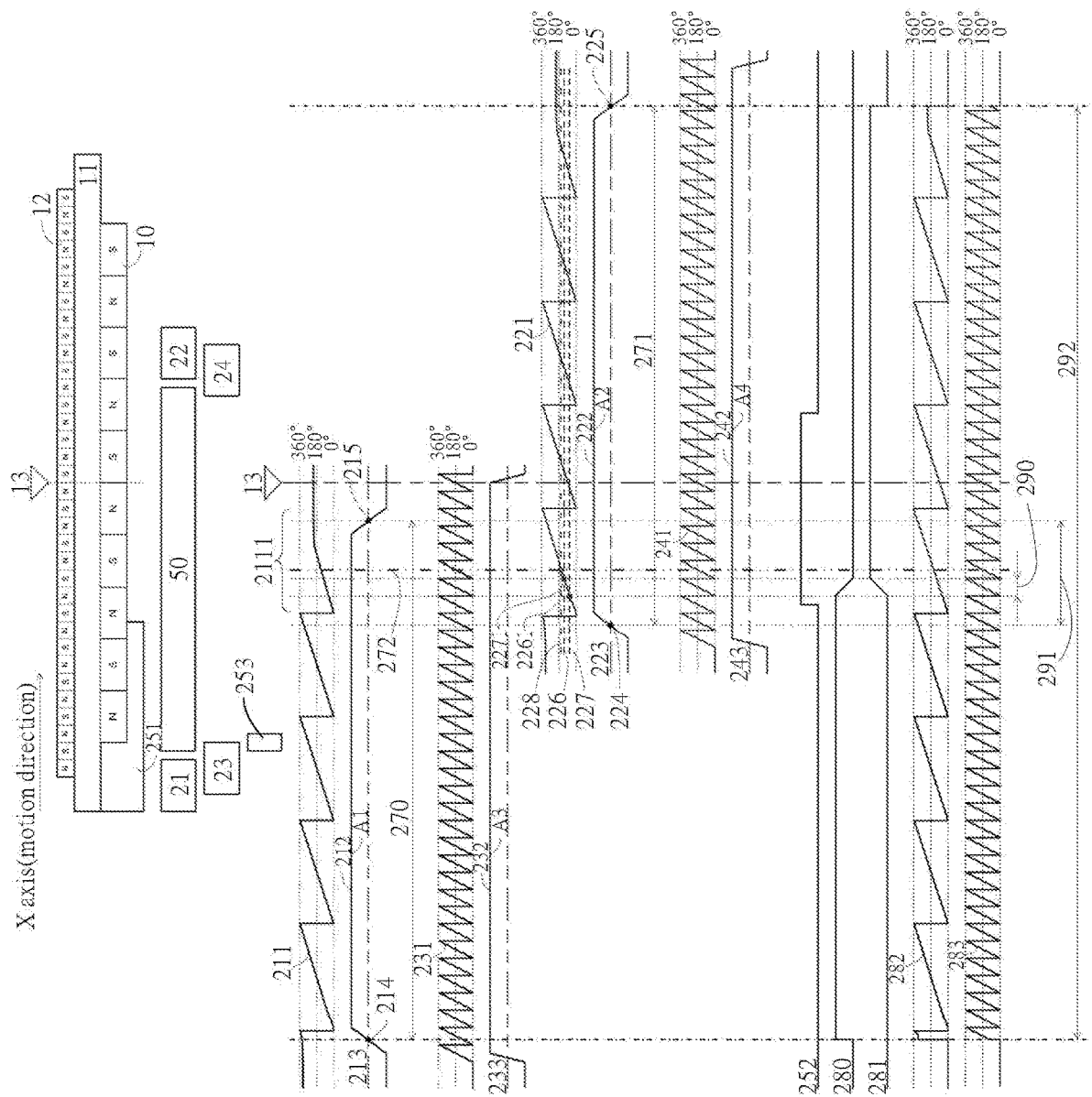
FIG. 4 is a schematic diagram of signals sensed by each sensor according to the first embodiment of the invention.

As shown in FIG. 4, a sub-period phase 231 of the third sensor 23 is synchronized with a phase 211 of the first sensor 21, for example, when the phase 211 is equal to 0, the phase 231 is also equal to zero. In addition, in FIG. 6, a current position of the carrier 11 is marked with a label 13, so as to be capable of knowing a positional status of each of the sensors.

The first sensor 21 becomes active when a signal amplitude 212 of the first sensor 21 is higher than a predetermined threshold value 213, and the threshold value is half of the maximum signal amplitude 212.

When the carrier 11 moves along the X-axis, the length L2 of the second signal array 12 is greater than the length L1 of the first signal array 10, enabling the third sensor 23 to be capable of detecting the carrier 11 earlier than the first sensor 21.

The signal amplitude 212 and a signal amplitude 222 of signals A1, A2 respectively measured by the Hall sensors 21, 22 are calculated as follows:

$$A=\sqrt{U_{cos+}^2+U_{sin+}^2} \quad \text{(formula 4)}$$

In FIG. 4, the signal amplitude 212 is equal to the threshold value 213 at positions 214, 215, and a spacing between the two positions 214, 215 is used as a measuring range 270 of the first sensor 21.

Signal amplitudes 232, 242 of signals A3, A4 respectively measured by the magnetoresistive sensors 23, 24 are calculated as follows:

$$A=\sqrt{V(U_{cos+}-U_{Cos-})^2+(U\text{Sin}+-U_{Sin-})^2} \quad \text{(formula 5)}$$

When the signal amplitude 232 of the third sensor 23 is higher than a predetermined threshold value 233, and the signal amplitude 212 of the first sensor 21 is higher than the threshold value 213, the third sensor 23 is switched to an active state, and an initial position 272 is used as a basis for position synchronization of the first signal array 10 and the second signal array 12.

The position synchronization refers to a new sub-period position x2' calculated according to formula 6 during switching from the first signal array 10 to the second signal array 12, and used for motor current commutation and high-precision position feedback.

$$x2'=(T2/2)\cdot\text{round}(x1/x2)+x2 \quad \text{(formula 6)}$$

wherein round(x) is a function of smaller integers found.

In FIG. 4, the signal amplitude 222 is equal to a threshold value 223 at positions 224, 225, and a spacing between the two positions 224, 225 is used as a measuring range 271 of the second sensor 22 and the fourth sensor 24, and a measuring range 292 of the measuring module 20 is made between the positions 214, 225.

When the carrier 11 enters or leaves the measuring ranges 270, 271 of the Hall sensors 21, 22 respectively, signals are distorted due to end effects caused by changes of magnetic field and the sensitive elements H1, H2 being not completely covered by the first signal array 10. Therefore, in order to continuously and smoothly measure a position of the carrier 11, a measuring range between the Hall sensors 21, 22 has an overlapping area 291, the overlapping area 291 is interposed between the positions 215, 224, and a range thereof is at least one magnetic period T1.

In order to further reduce the influence of end effects, the invention further defines a joining area 290 by a digital joining method, as shown in formula 7, when the carrier 11 is located in the joining area 290, the digital joining method uses a first weighting function 280 and a second weighting function 281 to sum up the phase 211 and a phase 221 of the Hall sensors 21, 22, respectively.

In addition, a timing of connecting the phases 211, 221 of the Hall sensors 21, is before the system switches to the second signal array 12, and a timing of connecting the phase 231 and a phase 241 of the magnetoresistive sensors 23, 24 is after the system switches to the second signal array 12.

As shown in FIG. 4, the phase 221 of the second sensor 22 uses joining phase threshold values 226, 227 to estimate the joining area 290, and the joining phase threshold values 226, 227 are respectively 60° and 120°, and positions 2261, 2271 are used as starting and ending points of the joining area 290, respectively.

In the joining area 290, a digitally connected phase 282 is calculated as follows:

$$\alpha 1_{join}=\alpha 1_{21}\cdot W1(\alpha 1_{22})+a1_{22}\cdot W2(\alpha 1_{22}) \quad \text{(formula 7)},$$

wherein $\alpha 1_{join}$ is the digitally connected phase 282 of each of the Hall sensors 21, 22, $\alpha 1_{21}$ is the phase 211 of the first sensor 21, $\alpha 1_{22}$ is the phase 221 of the second sensor 22, $W1(\alpha 1_{22})$ is the first weighting function 280, $W2(\alpha 1_{22})$ is the second weighting function 281, for example, the weighting function is a linear inverse function in the joining area 290 in FIG. 4. A digitally connected phase 283 of the magnetoresistive sensors 23, 24 is then calculated using formula 8.

$$a2_{join}=a2_{23}\cdot W1(\alpha 1_{22})+\alpha 2_{24}\cdot W2(\alpha 1_{22}) \quad \text{(formula 8)},$$

wherein $\alpha 2_{join}$ is the digitally connected phase 283 of each of the magnetoresistive sensors 23, 24, $a2_{23}$ is the phase 231 of the third sensor 23, and $a2_{24}$ is the phase 241 of the fourth sensor 24.

The first state sensor 25 can be an optical switch sensor for realizing position estimation, such as reference signal generation, connection of measurement results between other sensors and identification of homing direction, and has a marking unit and a sensitive element 253, wherein the marking unit 251 is disposed on the carrier 11 and adjacent to the first signal array 10, and its length L3 must be greater than a distance between the positions 2261, 2271. The sensitive element 253 is disposed on the base for sensing signals generated by the marking unit 251. When the carrier 11 enters a detection range of the first state sensor 25, especially between the positions 2261, 2271, and matches a positional relationship between the sensitive element 253 and the marking unit 251, the first state sensor 25 is enabled to become active.

According to a way in which the aforementioned sensors are arranged, the joining area 290 is defined by a state signal 252, the phase 221, the joining phase threshold values 226, 227, and the threshold values 213, 223.

Then, in order to establish an incremental absolute measurement system, a homing process, also known as an axis initialization run, must be performed, and the initial position 272 is disposed on a moving path as a reference for triggering switching, and the driving unit 40 is enabled to drive the carrier 11 to move to reach the initial position 272 to determine an absolute position of the carrier 11 and obtain a reference signal.

In FIG. 4, the initial position 272 is obtained according to the threshold values 213, 223 of the Hall sensors 21, 22 and an initial position threshold value 228 of the second sensor 22. Wherein the initial position threshold value 228 is 150°.

Considering a positional relationship between the first state sensor 25, the joining area 290 and the initial position 272, the length L3 of the marking unit 251 must be greater than a distance between the position 2261 and the initial position 272.

Figure 6:
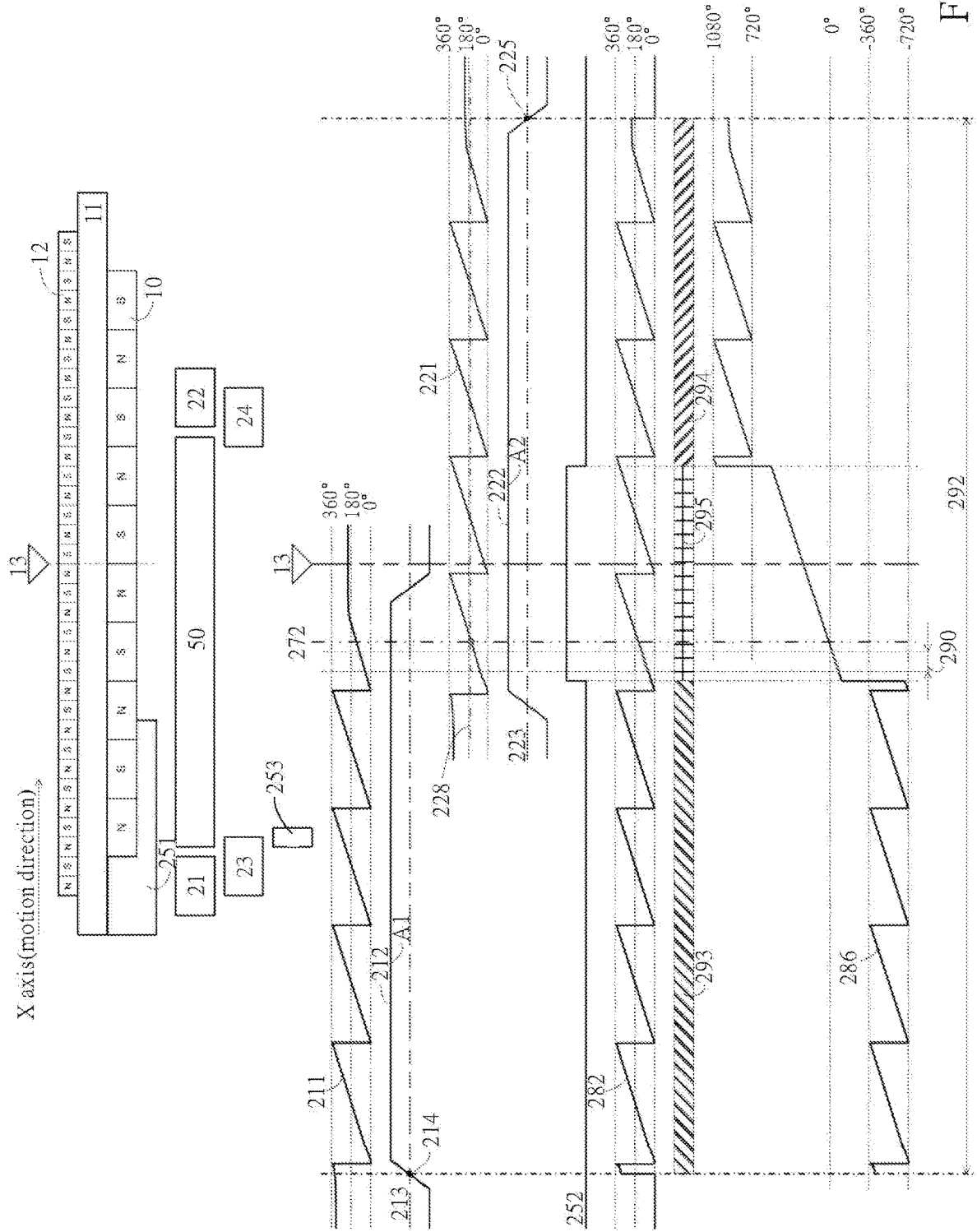
FIG. 6 is a schematic diagram of further defining an absolute area based on FIG. 5.

In addition, in order to ensure an uniqueness of the step length DM of the modular component 60, the first state sensor 25 is only activated in a last period 2111 of the first sensor 21, as shown in FIG. 6. The period 2111 refers to a period in which the signal A1 becomes smaller than the threshold value 213 when the carrier 11 is moving.

Then, when the phase 211 of the first sensor 21 is between 0° and 60°, the state signal 252 becomes active.

The length L3 of the marking unit 251 is equal to the magnetic period T1 to ensure an uniqueness of the period 2111.

Figure 5:
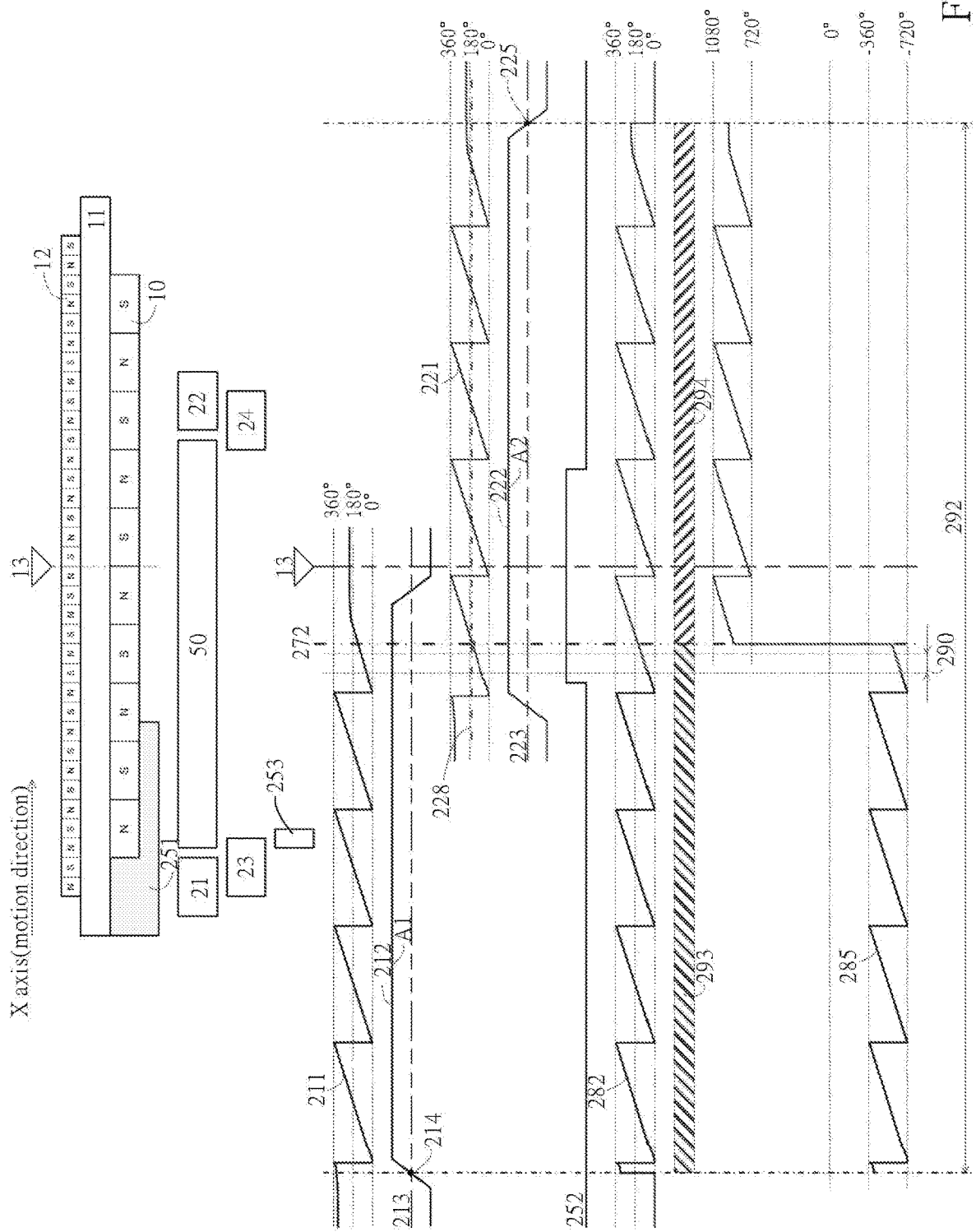
FIG. 5 is a schematic diagram of related signals and positions in an initialization procedure according to the first embodiment of the invention.

In FIG. 5, the measuring range 292 is divided into a positive homing area 293 and a negative homing area 294 by the initial position 272, and an automatic homing direction is determined through states of the first state sensor 25 and the Hall sensors 21, 22. Wherein if the carrier 11 is at the initial position 272, and the phase 221 of the second sensor 22 is equal to the initial position threshold value 228, and the state signal is in an active state, then no homing is required.

When the carrier 11 is located in the positive homing area 293, zeroing correction must be performed in a positive direction of the X-axis, and the following conditions must be met: the state signal 252 is in an active state, the phase 221 is lower than the initial position threshold value 228, e.g., the phase 221 is between 30° and 150°, the signal A1 is higher than the amplitude threshold value 213; or, the state signal is not active and signal A1 is higher than the amplitude threshold value 213.

When the carrier 11 is in the negative homing area 294, homing must be performed in a negative direction of the X-axis.

In FIG. 4, the processing unit 30 determines a homing direction by increasing or decreasing the digitally connected phases 282, 283. Wherein if a homing direction is positive, the digitally connected phase 282 is subtracted by two magnetic periods T1, that is, −720°; if a homing direction is negative, add two magnetic periods T1 to the digitally connected phase 282, that is, +720°. Then, when the driving unit 40 receives a correction phase 285 calculated by the processing unit 30, position is decoded and homing direction is estimated.

In addition, if the length L3 of the marking unit 251 is less than two magnetic periods T1 and the state signal 252 is in an active state, the invention can further perform absolute position estimation without performing homing correction.

As shown in FIG. 6, an absolute area 295 is further distinguished in the measuring range 292 within an activation range of the state signal 252, so as to calculate an absolute position and an automatic homing direction.

Wherein if the carrier 11 is located in the absolute area 295, and the state signal is in an active state, no homing is required, and the absolute position is calculated as follows:

when the signal A1 is higher than the threshold value 213:

$$X_{abs}=(T1/360°)(a1_{join}-\alpha_{home}) \quad \text{(formula 9)},$$

wherein $X_{abs}$ is a standard absolute phase 286, $\alpha_{home}$ is the initial position threshold value 228, for example, $\alpha_{home}=150°$;

when the signal A1 is not higher than the threshold value 213:

$$X_{abs}=(T1/360°)(a1_{join}-\alpha_{home})+T1 \quad \text{(formula 10)}$$

If the carrier 11 is located in the positive homing area 293, and the state signal is inactive, when the signal A1 is higher than the threshold value 213, zeroing correction must be performed in the positive direction of the X-axis.

If the carrier 11 is located in the negative homing area 294, homing must be performed in the negative direction of the X-axis.

In addition, the invention is powered by a discontinuous stator permanent-magnetic linear synchronous motor, only when the first signal array 10 is located above the stator 50 and an overlapping area of the first signal array 10 and the stator 50 is at least one magnetic period T1, automatic homing direction calculation is performed to avoid the motor being unable to provide sufficient driving force for the carrier 11.

Figure 7:
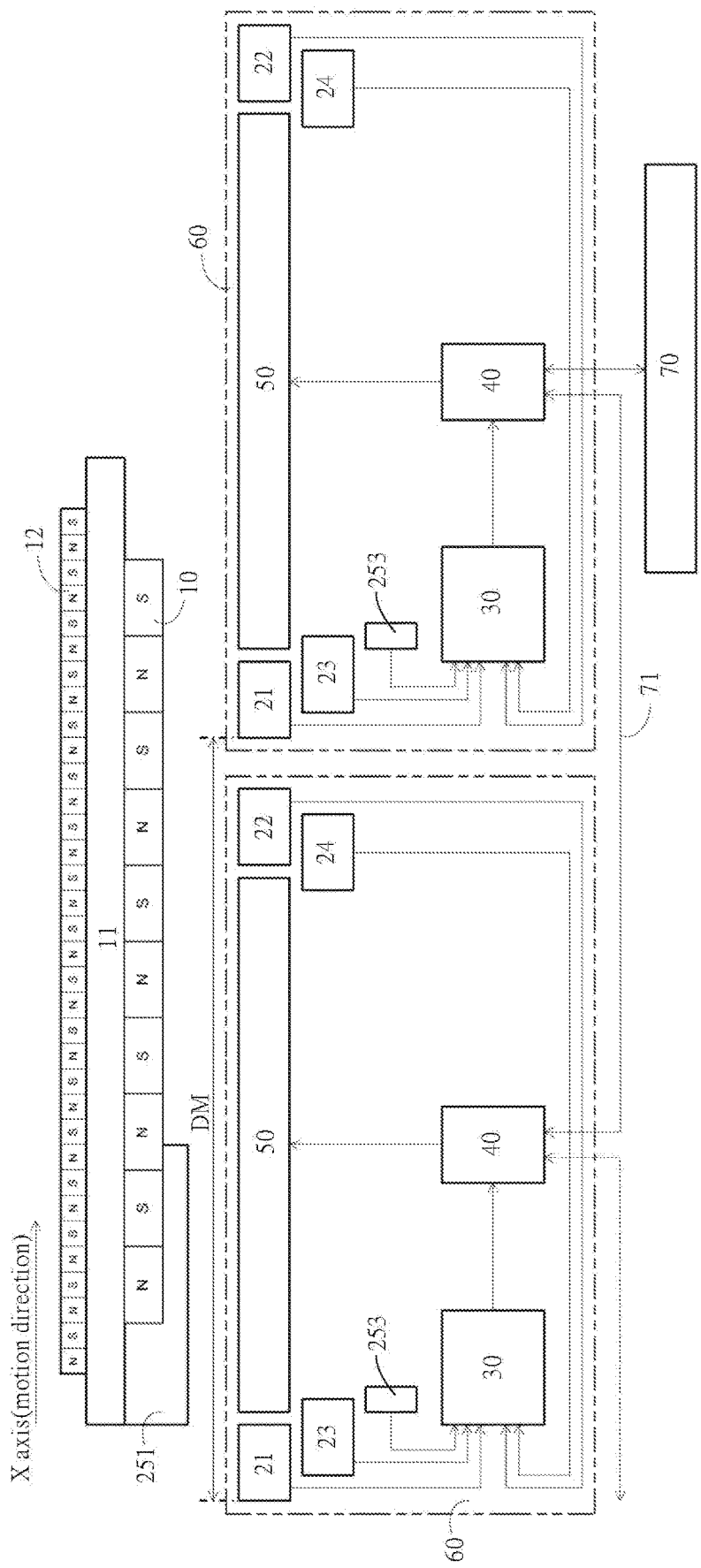
FIG. 7 is a second embodiment of the invention showing that a number of a modular component is two.

As shown in FIG. 7, in order to continuously measure a position of the carrier 11, in a second embodiment of the invention, the modular components 60 can be configured along a moving path of the carrier 11, a distance between the initial positions 272 of the two adjacent modular components 60 is equal to the step length DM of the single modular component 60, and there is an overlapping measuring area between the two adjacent modular components 60. The two adjacent modular components 60 are electrically connected with a field bus 71, and then connected to a motion controller 70 for controlling movement of the carrier 11.

The motion controller 70 analyzes a received standard absolute phase 287 of the adjacent modular component 60, and performs homing calculation with one of the modular components 60. Then, if the received standard absolute phase 287 is lower than four magnetic periods T1, i.e., +1440°, the modular component 60 ordered first on the X-axis is selected; otherwise, the modular component 60 ordered last on the X-axis is selected.

Figure 8:
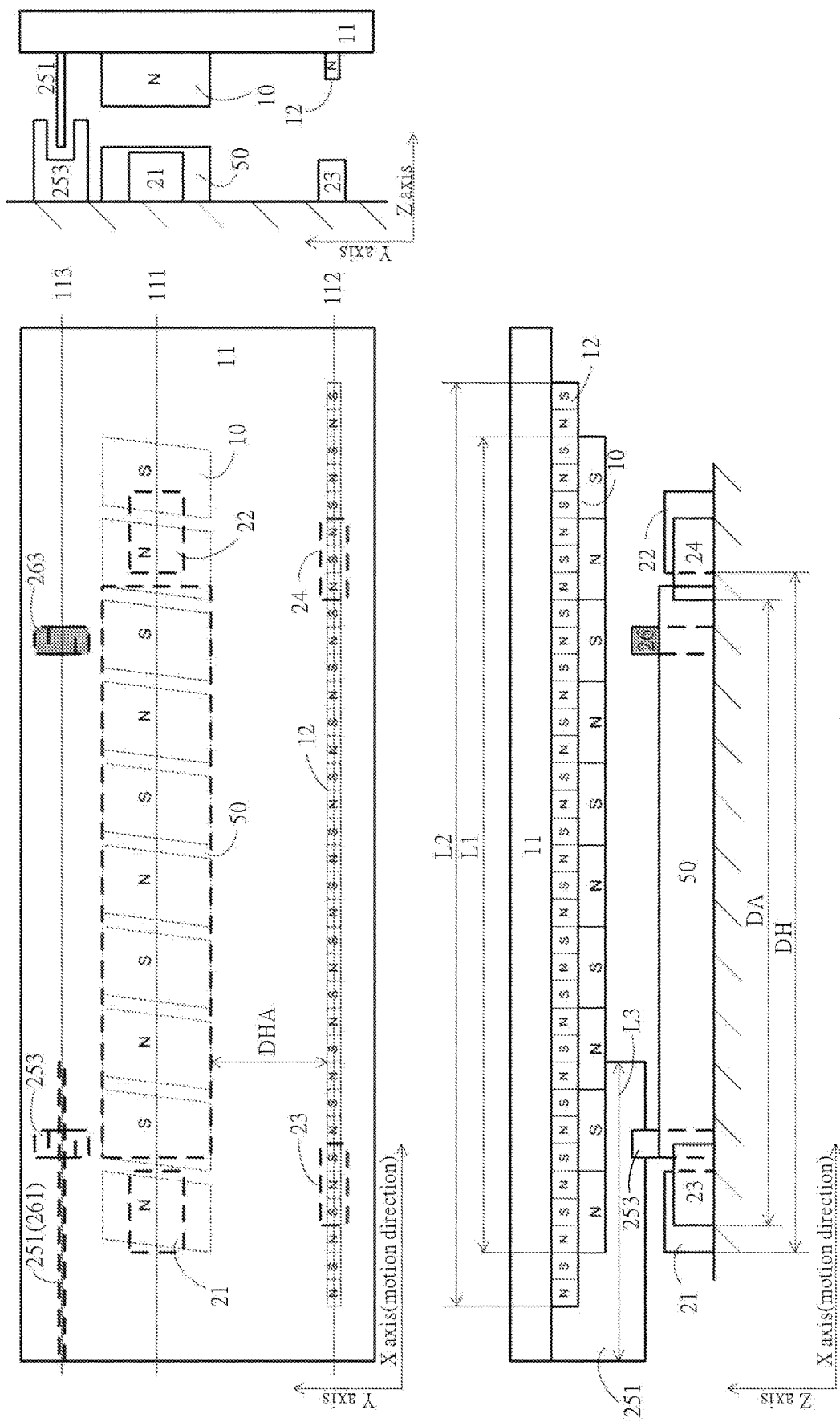
FIG. 8 is a plan view, a side view and a front view of a third embodiment of the invention.
Figure 9:
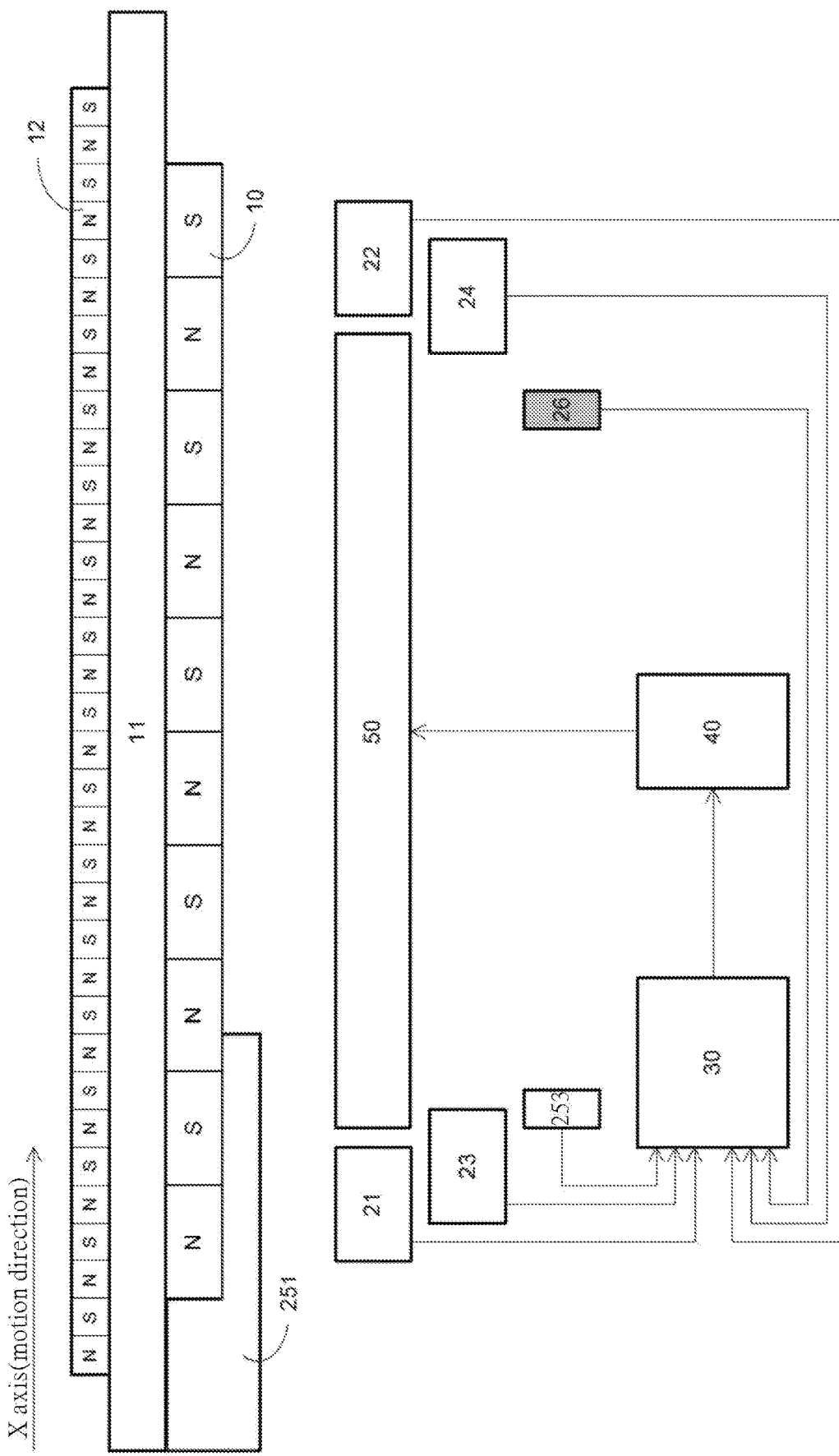
FIG. 9 is a schematic diagram of the third embodiment of the invention.
Figure 10:
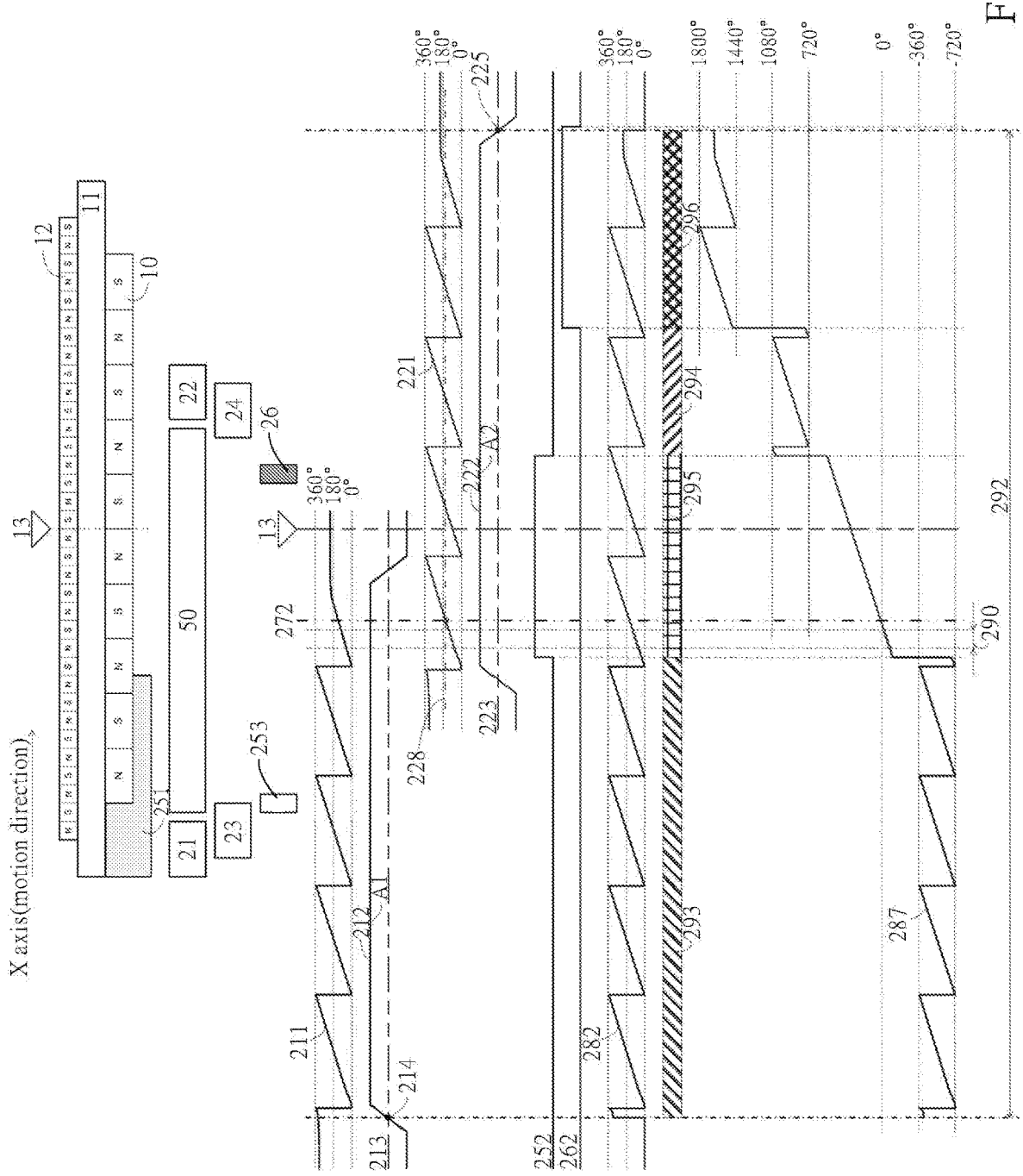
FIG. 10 is a schematic diagram of coding principle for a second state sensor according to the third embodiment of the invention.

When the carrier 11 is located between the two adjacent modular components 60, the following two situations may occur. One situation is that the two modular components 60 are capable of performing homing, but the two modular components are homing in opposite directions; another situation is that the carrier 11 is incapable of moving due to insufficient overlapping area. Therefore, in order to solve the aforementioned problem, as shown in a third embodiment of the invention in FIG. 8 to FIG. 10, main differences from the first embodiment are that a second state sensor 26 is added, which can be an optical switch sensor, has a sensitive element 263 for sensing the marking unit 251 or another independent marking unit 261, and is placed at an end of the measuring range 292 so that the processing unit 30 can be aware of the measuring range 292 is about to end, and an end area 296 is further distinguished in the measuring range 292 within an activation range of a state signal 262.

When the carrier 11 is located in the end area 296, the state signal 262 of the second state sensor 26 is activated, and the processing unit 30 adds four magnetic periods T1, i.e., +1440°, to the digitally connected phase 282 for correction to obtain the standard absolute phase 287 and sends the standard absolute phase 287 to the driving unit 40, and then to the motion controller 70 via the field bus 71.

Figure 11:
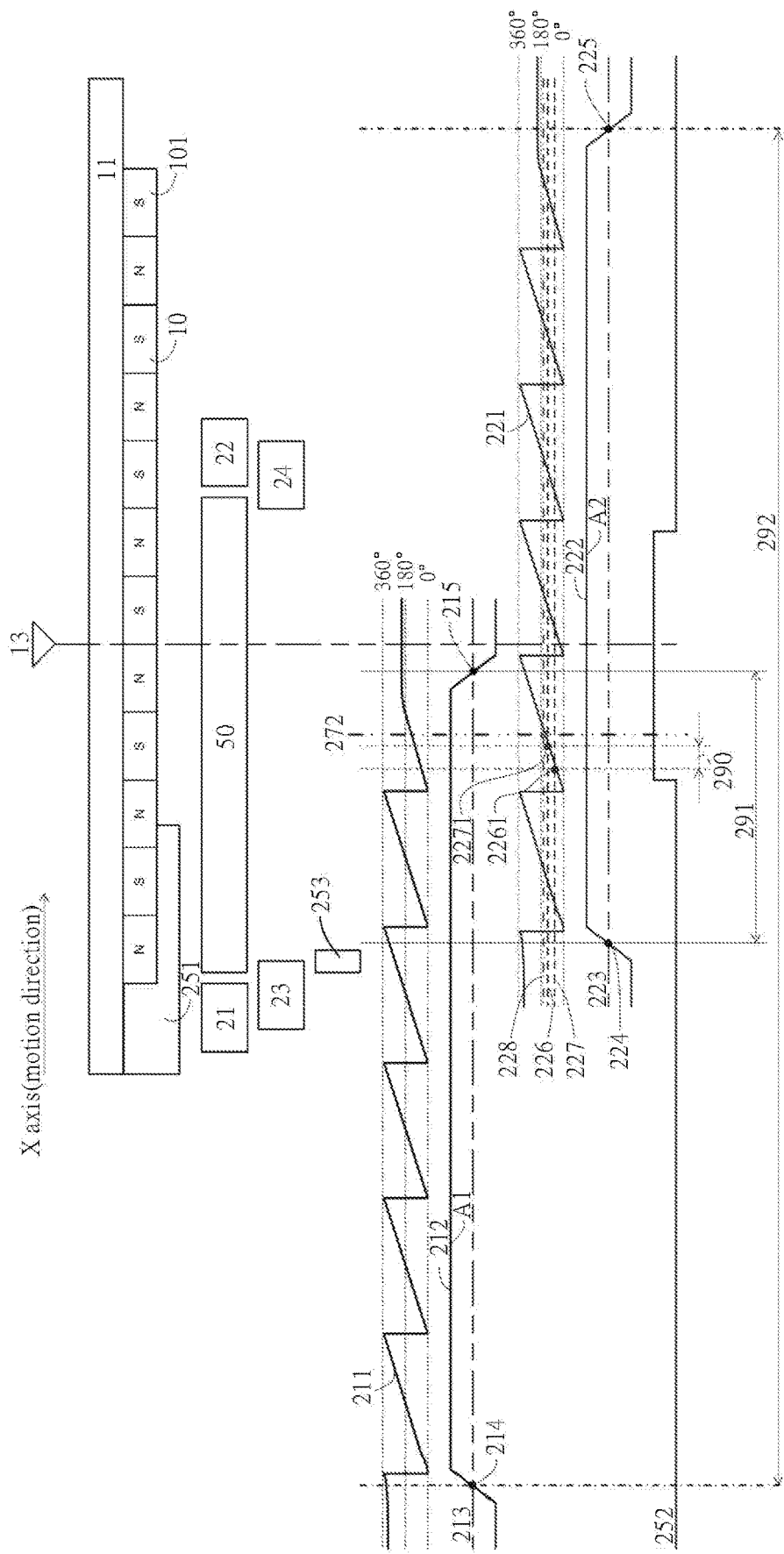
FIG. 11 is a schematic diagram of a fourth embodiment of the invention showing a mode of increasing step pitch.

As shown in a fourth embodiment of the invention in FIG. 11, main difference from the first embodiment are that the magnetic element (magnet) 101 is added to the first signal array 10 to change the step length DM, and the overlapping area 291 also changes accordingly, so the invention uses the first state sensor 25 as an auxiliary to ensure an uniqueness of the overlapping area 291.

A fifth embodiment shown in FIG. 12 is provided after the fourth embodiment, in which the two modular components 60 are used to identify an automatic homing direction, and the modular component 60 ordered last on the X-axis must perform zeroing correction in the positive direction of the X-axis.

During homing procedure, the invention further uses a sensor redundancy technique to automatically identify the different carriers 11. In FIG. 13, a mechanical shift d12 is defined by phase changes between the signal arrays 10, 12. In order not to affect a calculation result of formula 6, the mechanical shift d12 is less than 0.5 mm, and the mechanical shifts d12 of the different carriers 11 must have a difference of 0.05 mm for identification. The second sensor 22 or the fourth sensor 24 is capable of measuring the mechanical shift d12, and the motion controller 70 is stored with the mechanical shifts d12 of all the carriers 11 for decoding.

In this embodiment, the initial position 272 in a homing procedure is used as a measuring position for identifying the carrier 11 to avoid the problems of different measurement results and reduced accuracy due to different reference positions.

What is claimed is:

1. A multi-sensor position measurement system comprising:
    a base;
    a carrier capable of moving relative to the base;
    a first signal array and a second signal array disposed on the carrier and spaced apart from each other, and respectively having a plurality of signal source elements arranged in sequence, and a signal period of the second signal array being less than a signal period of the first signal array; and
    a modular component having a measuring module and a processing unit, wherein the measuring module comprises:
    a first sensor and a second sensor disposed on the base and spaced apart from each other for sensing signals of the first signal array;
    a third sensor and a fourth sensor disposed on the base and spaced apart from each other for sensing signals of the second signal array; and
    a first state sensor having a marking unit disposed on the carrier and a sensitive element disposed on the base for sensing signals generated by the marking unit;
    the processing unit receiving signals detected by the sensors and calculating a position of the carrier;
    wherein when the first state sensor is activated, the first state sensor is located at an end of a measuring range of the first sensor, and an amplitude signal of the second sensor is higher than a predetermined threshold value.

2. The multi-sensor position measurement system as claimed claim 1, wherein the processing unit calculates measurement results of the sensors by using a weighting function to obtain a reference signal.

3. The multi-sensor position measurement system as claimed in claim 2, wherein the processing unit compares an amplitude signal of the first sensor and the second sensor with a predetermined threshold value according to the reference signal, and analyzes a state of the first state sensor for using as a basis for estimating a moving direction of the carrier.

4. The multi-sensor position measurement system as claimed in claim 1, wherein a mechanical shift related to a signal period is defined by phase changes between the first signal array and the second signal array on the carrier for the processing unit to identify the carrier.

5. The multi-sensor position measurement system as claimed in claim 1, wherein the modular component further comprises a stator, and the sensors are respectively located on two sides of the stator, when the first signal array is located above the stator, the processing unit starts homing operation.

6. A multi-sensor position measurement system comprising:
    a base;
    a carrier capable of moving relative to the base;
    a first signal array and a second signal array disposed on the carrier and spaced apart from each other, and respectively having a plurality of signal source elements arranged in sequence, and a signal period of the second signal array being less than a signal period of the first signal array; and
    a modular component having a measuring module and a processing unit, wherein the measuring module comprises:
    a first sensor and a second sensor disposed on the base and spaced apart from each other for sensing signals of the first signal array;
    a third sensor and a fourth sensor disposed on the base and spaced apart from each other for sensing signals of the second signal array; and
    a first state sensor having a marking unit disposed on the carrier and a sensitive element disposed on the base for sensing signals generated by the marking unit;
    the processing unit receiving signals detected by the sensors and calculating a position of the carrier;
    wherein the measuring module further comprises a second state sensor located at an end of a measuring range of the measuring module and having a marking unit disposed on the carrier and a sensitive element disposed on the base for sensing signals generated by the marking unit.

7. The multi-sensor position measurement system as claimed in claim 6, wherein when the second state sensor is activated, the second state sensor is located at an end of a measuring range of the second sensor, and an amplitude signal of the first sensor is lower than a predetermined threshold value.

8. The multi-sensor position measurement system as claimed in claim 6, wherein a mechanical shift related to a signal period is defined by phase changes between the first signal array and the second signal array on the carrier for the processing unit to identify the carrier.

9. The multi-sensor position measurement system as claimed in claim 6, wherein the modular component further comprises a stator, and the sensors are respectively located on two sides of the stator, when the first signal array is located above the stator, the processing unit starts homing operation.

10. A multi-sensor position measurement system comprising:
    a base;
    a carrier capable of moving relative to the base;
    a first signal array and a second signal array disposed on the carrier and spaced apart from each other, and respectively having a plurality of signal source elements arranged in sequence, and a signal period of the second signal array being less than a signal period of the first signal array; and
    a modular component having a measuring module and a processing unit, wherein the measuring module comprises:
    a first sensor and a second sensor disposed on the base and spaced apart from each other for sensing signals of the first signal array;

a third sensor and a fourth sensor disposed on the base and spaced apart from each other for sensing signals of the second signal array; and a first state sensor having a marking unit disposed on the carrier and a sensitive element disposed on the base for sensing signals generated by the marking unit;

the processing unit receiving signals detected by the sensors and calculating a position of the carrier;

wherein a measuring range of the measuring module is divided into a positive homing area and a negative homing area by an initial position, and an automatic homing direction of the carrier is estimated through measurement results of the sensors.

11. The multi-sensor position measurement system as claimed in claim 10, wherein a mechanical shift related to a signal period is defined by phase changes between the first signal array and the second signal array on the carrier for the processing unit to identify the carrier.

12. The multi-sensor position measurement system as claimed in claim 10, wherein the modular component further comprises a stator, and the sensors are respectively located on two sides of the stator, when the first signal array is located above the stator, the processing unit starts homing operation.

* * * * *